United States Patent
Kamei

(10) Patent No.: US 7,518,163 B2
(45) Date of Patent: Apr. 14, 2009

(54) GALLIUM NITRIDE-BASED COMPOUND SEMICONDUCTOR LIGHT-EMITTING DEVICE AND NEGATIVE ELECTRODE THEREOF

(75) Inventor: Koji Kamei, Ichihara (JP)

(73) Assignee: Showa Denko K.K., Tokyo (JP)

( * ) Notice: Subject to any disclaimer, the term of this patent is extended or adjusted under 35 U.S.C. 154(b) by 351 days.

(21) Appl. No.: 10/582,913

(22) PCT Filed: Dec. 16, 2004

(86) PCT No.: PCT/JP2004/019284

§ 371 (c)(1),
(2), (4) Date: Jun. 14, 2006

(87) PCT Pub. No.: WO2005/059982

PCT Pub. Date: Jun. 30, 2005

(65) Prior Publication Data

US 2007/0096126 A1    May 3, 2007

Related U.S. Application Data

(60) Provisional application No. 60/532,722, filed on Dec. 29, 2003.

(30) Foreign Application Priority Data

Dec. 17, 2003    (JP) ............................. 2003-419336

(51) Int. Cl.
*H01L 27/15* (2006.01)
(52) U.S. Cl. .................. 257/103; 257/79; 257/189; 257/11; 257/E33.025

(58) Field of Classification Search ................. 257/676, 257/103, 79, 745, 189, 11, E33.025, E25.032; 438/676, 29, 21, 22, 46, 47
See application file for complete search history.

(56) References Cited

U.S. PATENT DOCUMENTS

2003/0194826 A1    10/2003    Chiyo
2004/0149999 A1*    8/2004    Uemura et al. .............. 257/103

FOREIGN PATENT DOCUMENTS

| JP | 5-291621 A | 11/1993 |
|---|---|---|
| JP | 2002-368271 A | 12/2002 |
| JP | 2003-110140 A | 4/2003 |
| JP | 2003-224298 A | 8/2003 |

* cited by examiner

*Primary Examiner*—Evan Pert
*Assistant Examiner*—Scott R Wilson
(74) *Attorney, Agent, or Firm*—Sughrue Mion, PLLC

(57) ABSTRACT

A gallium nitride-based compound semiconductor light-emitting device is disclosed which includes an n-type semiconductor layer of a gallium nitride-based compound semiconductor, a light-emitting layer of a gallium nitride-based compound semiconductor and a p-type semiconductor layer of a gallium nitride-based compound semiconductor formed on a substrate in this order, and has a negative electrode and a positive electrode provided on the n-type semiconductor layer and the p-type semiconductor layer, respectively. The negative electrode includes a bonding pad layer and a contact metal layer which is in contact with the n-type semiconductor layer, and the contact metal layer is composed of a Cr—Al alloy.

22 Claims, 1 Drawing Sheet

GALLIUM NITRIDE-BASED COMPOUND SEMICONDUCTOR LIGHT-EMITTING DEVICE AND NEGATIVE ELECTRODE THEREOF

CROSS REFERENCE TO RELATED APPLICATION

This application is an application filed under 35 U.S.C. §111(a) claiming benefit, pursuant to 35 U.S.C. §119(e) (1), of the filing date of the Provisional Application No. 60/532,722 filed on Dec. 29, 2003, pursuant to 35 U.S.C. §111(b).

TECHNICAL FIELD

The present invention relates to a gallium nitride-based compound semiconductor light-emitting device, and more particularly to a flip-chip-type gallium nitride-based compound semiconductor light-emitting device having a negative electrode that exhibits excellent characteristics and can be fabricated with high productivity.

BACKGROUND ART

In recent years, gallium nitride-based compound semiconductors represented by the formula $Al_xGa_yIn_{1-x-y}N$ ($0 \leq x \leq 1$, $0 \leq y \leq 1$, $x+y \leq 1$) have become of interest as materials for producing a light-emitting diode (LED) which emits ultraviolet to blue light, or green light. Through employment of such a compound semiconductor, ultraviolet light, blue light, or green light of high emission intensity can be obtained; such high-intensity light has conventionally been difficult to attain. Unlike the case of a GaAs light-emitting device, such a gallium nitride-based compound semiconductor is generally grown on a sapphire substrate (i.e., an insulating substrate); hence, an electrode cannot be provided on the back surface of the substrate. Therefore, both a negative electrode and a positive electrode must be provided on semiconductor layers formed through crystal growth on the substrate.

In the case of the gallium nitride-based compound semiconductor device, the sapphire substrate is transparent with respect to emitted light. Therefore, attention is drawn to a flip-chip-type light-emitting device, which is configured by mounting the semiconductor device on a lead frame and the like such that the electrodes face the frame, whereby emitted light is emitted through the sapphire substrate.

FIG. 1 is a schematic representation showing a general structure of a flip-chip-type light-emitting device. Specifically, the light-emitting device includes a substrate 1, a buffer layer 2, an n-type semiconductor layer 3, a light-emitting layer 4, and a p-type semiconductor layer 5, the layers being formed atop the substrate through crystal growth. A portion of the light-emitting layer 4 and a portion of the p-type semiconductor layer 5 are removed through etching, thereby exposing a portion of the n-type semiconductor layer 3 to the outside. A positive electrode 10 is formed on the p-type semiconductor layer 5, and a negative electrode 20 is formed on the exposed portion of the n-type semiconductor layer 3. The light-emitting device is mounted on, for example, a lead frame such that the electrodes face the frame, followed by bonding.

During mounting of a flip-chip-type light-emitting device, a negative electrode is heated to some hundreds of degrees Celsius. Therefore, the negative electrode of a flip-chip-type light-emitting device is required to resist deterioration, in characteristics, caused by heating.

As an exemplary negative electrode which provides excellent Ohmic contact with a gallium nitride-based compound semiconductor, there has been known an electrode that is formed through vapor deposition of an alloy of Cr with at least one metallic element selected from among Au, Pt, Mo, Ti, In, and Ga on an n-type gallium nitride-based compound semiconductor layer (see, for example, Japanese Laid-Open Patent Application (kokai) No. 6-275868). However, when heated, the negative electrode has deteriorated characteristics. Another known negative electrode is formed through vapor deposition, on an n-type gallium nitride-based compound semiconductor layer, of an undercoat layer formed of at least one metal selected from the group consisting of V, Nb, Zr, and Cr, or formed of an alloy containing the metal and, on the undercoat layer, a main electrode formed of a metal different from the metal forming the undercoat layer, followed by thermally annealing the formed multi-layer structure (see, for example, Japanese Laid-Open Patent Application (kokai) No. 10-112555). However, as the above method includes a thermal annealing step after formation of a negative electrode, productivity of the electrode is unsatisfactory.

DISCLOSURE OF INVENTION

An object of the present invention is to provide a negative electrode which attains excellent Ohmic contact with an n-type gallium nitride-based compound semiconductor layer, which resists deterioration, in characteristics, which would be caused by heating, and which can be produced at high efficiency. Another object of the invention is to provide a gallium nitride-based compound semiconductor light-emitting device having the negative electrode.

The present invention provides the following.

(1) A gallium nitride-based compound semiconductor light-emitting device comprising an n-type semiconductor layer of a gallium nitride-based compound semiconductor, a light-emitting layer of a gallium nitride-based compound semiconductor and a p-type semiconductor layer of a gallium nitride-based compound semiconductor formed on a substrate in this order, and having a negative electrode and a positive electrode provided on the n-type semiconductor layer and the p-type semiconductor layer, respectively; wherein the negative electrode comprises a bonding pad layer and a contact metal layer which is in contact with the n-type semiconductor layer, and the contact metal layer is composed of a Cr—Al alloy.

(2) A gallium nitride-based compound semiconductor light-emitting device according to (1) above, wherein the Cr—Al alloy has a Cr content of 10 to 90 mass %.

(3) A gallium nitride-based compound semiconductor light-emitting device according to (2) above, wherein the Cr—Al alloy has a Cr content of 20 to 80 mass %.

(4) A gallium nitride-based compound semiconductor light-emitting device according to (3) above, wherein the Cr—Al alloy has a Cr content of 40 to 60 mass %.

(5) A gallium nitride-based compound semiconductor light-emitting device according to any one of (1) to (4) above, wherein the contact metal layer has a thickness of 1 to 500 nm.

(6) A gallium nitride-based compound semiconductor light-emitting device according to (5) above, wherein the contact metal layer has a thickness of 10 nm or more.

(7) A gallium nitride-based compound semiconductor light-emitting device according to any one of (1) to (6) above, wherein the bonding pad layer is formed of a metal selected from the group consisting of Au, Al, Ni, and Cu, or an alloy containing the metal.

(8) A gallium nitride-based compound semiconductor light-emitting device according to any one of (1) to (7) above, wherein the bonding pad layer has a thickness of 100 to 1,000 nm.

(9) A gallium nitride-based compound semiconductor light-emitting device according to (8) above, wherein the bonding pad layer has a thickness of 200 to 500 nm.

(10) A gallium nitride-based compound semiconductor light-emitting device according to any one of (1) to (9) above, wherein an Au—Sn alloy layer is provided on the bonding pad layer.

(11) A gallium nitride-based compound semiconductor light-emitting device according to (10) above, wherein the Au—Sn alloy layer has a thickness of 200 nm or more.

(12) A gallium nitride-based compound semiconductor light-emitting device according to any one of (1) to (9) above, wherein a lead free solder layer is provided on the bonding pad layer.

(13) A gallium nitride-based compound semiconductor light-emitting device according to (12) above, wherein the lead free solder layer has a thickness of 200 nm or more.

(14) A gallium nitride-based compound semiconductor light-emitting device according to any one of (1) to (13) above, wherein the light-emitting device has an adhesion layer formed of Ti between the contact metal layer and the bonding pad layer.

(15) A gallium nitride-based compound semiconductor light-emitting device according to (14) above, wherein the adhesion layer has a thickness of 1 to 100 nm.

(16) A gallium nitride-based compound semiconductor light-emitting device according to (15) above, wherein the adhesion layer has a thickness of 10 nm or more.

(17) A gallium nitride-based compound semiconductor light-emitting device according to any one of (1) to (13) above, wherein the light-emitting device has a barrier layer between the contact metal layer and the bonding pad layer.

(18) A gallium nitride-based compound semiconductor light-emitting device according to any one of (10) to (16) above, wherein the light-emitting device has a barrier layer between the bonding pad layer and the Au—Sn alloy layer or the lead free solder layer.

(19) A gallium nitride-based compound semiconductor light-emitting device according to (17) or (18) above, wherein the barrier layer is formed of a metal selected from the group consisting of Ti, Zr, Hf, Ta, W, Re, Os, Ir, Pt, Fe, Co, Ni, Ru, Rh, and Pd, or an alloy containing the metal.

(20) A gallium nitride-based compound semiconductor light-emitting device according to (19) above, wherein the barrier layer is formed of a metal selected from the group consisting of Ti, Ta, W, and Pt, or an alloy containing the metal.

(21) A gallium nitride-based compound semiconductor light-emitting device according to any one of (17) to (20) above, wherein the barrier layer has a thickness of 10 to 500 nm.

(22) A gallium nitride-based compound semiconductor light-emitting device according to (21) above, wherein the barrier layer has a thickness of 50 to 300 nm.

(23) A gallium nitride-based compound semiconductor light-emitting device according to any one of (1) to (22) above, wherein the light-emitting device is of a flip-chip type.

(24) A negative electrode for use in a gallium nitride-based compound semiconductor light-emitting device comprising a bonding pad layer and a contact metal layer which is in contact with the n-type semiconductor layer, wherein the contact metal layer is composed of a Cr—Al alloy.

(25) A negative electrode for use in a gallium nitride-based compound semiconductor light-emitting device according to (24) above, wherein the light-emitting device is of a flip-chip type.

The negative electrode according to the present invention has a contact metal layer comprising a Cr—Al alloy. Thus, the negative electrode attains excellent Ohmic contact with an n-type gallium nitride-based compound semiconductor layer and is not deteriorated, in characteristics, by heating. Such an excellent Ohmic contact between the negative electrode of the present invention and the n-type gallium nitride-based compound semiconductor layer can be provided without performing annealing. Therefore, the gallium nitride-based compound semiconductor light-emitting device of the present invention can be produced with remarkably high efficiency.

BEST MODES FOR CARRYING OUT THE INVENTION

Figure 1:
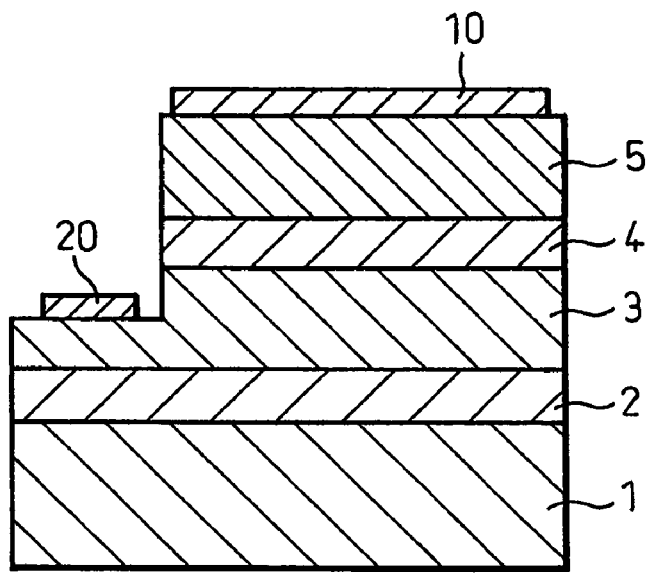
FIG. 1 is a schematic view showing a general structure of a conventional flip-chip-type compound semiconductor light-emitting device.

In the present invention, no particular limitations are imposed on the gallium nitride-based compound semiconductor layers stacked on a substrate, so long as the semiconductor stacked layers have a structure as shown in FIG. 1; i.e., a stacked structure including a buffer layer 2, an n-type semiconductor layer 3, a light-emitting layer 4, and a p-type semiconductor layer 5, the layers being formed atop a substrate 1 through crystal growth. No particular limitation is imposed on the type of the substrate, and any conventionally known substrate, such as a sapphire substrate or an SiC substrate, may be employed. No particular limitation is imposed on the type of the gallium nitride-based compound semiconductor, and conventionally known gallium nitride-based compound semiconductors represented by formula: $Al_xGa_yIn_{1-x-y}N$ ($0 \leq x \leq 1$, $0 \leq y \leq 1$, $x+y \leq 1$) may be employed.

Figure 2:
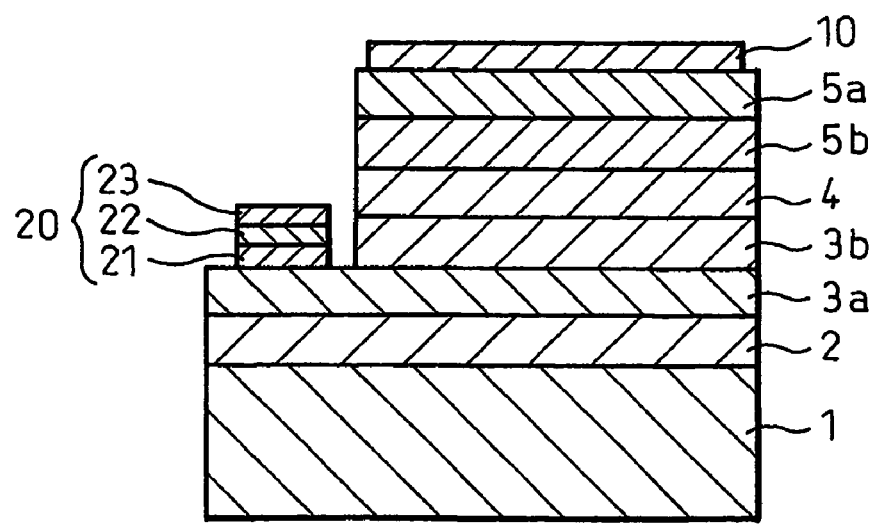
FIG. 2 is a schematic view showing an exemplary flip-chip-type gallium nitride-based compound semiconductor light-emitting device according to the present invention.

FIG. 2 shows one exemplary employable stacked structure in which an AlN buffer layer 2, an n-type GaN contact layer 3a, an n-type GaN lower cladding layer 3b, an InGaN light-emitting layer 4, a p-type AlGaN upper cladding layer 5b, and a p-type GaN contact layer 5a are sequentially stacked on a sapphire substrate 1. No particular limitation is imposed on the composition and structure of a positive electrode 10 to be provided atop the contact layer 5a, and a positive electrode having a conventional composition and structure (e.g., Al) may be employed.

A portion of the contact layer 5a, that of the upper cladding layer 5b, that of the light-emitting layer 4, and that of the lower cladding layer 3b, these layers being formed of the aforementioned gallium nitride-based compound semiconductor, are removed through etching, and a negative electrode 20 is provided on the thus-exposed portion of the contact layer 3a. The negative electrode 20 is constituted of a contact metal layer 21, an adhesion layer 22, and a bonding pad layer 23.

According to the present invention, the negative electrode at least contains layers; i.e., a contact metal layer which is in Ohmic contact with an n-type semiconductor layer, and a bonding pad layer for establishing electric contact with a circuit substrate, a lead frame, etc., and the contact metal layer is composed of a Cr—Al alloy. As the contact metal layer is formed of a Cr—Al alloy, thermally induced deterioration, in characteristics, can be prevented. Thus, a negative electrode which has a low contact resistance and which can be produced with high efficiency can be obtained.

The contact metal layer preferably has a thickness of 1 nm or more. A layer thickness of 5 nm or more is particularly preferred, from the viewpoint of attainment of low resistance. The thickness is more preferably 10 nm or more, as a constant low resistance can then be attained. However, when the thickness is excessively large, productivity decreases. Thus, the thickness is preferably 500 nm or less, more preferably 200 nm or less.

The Cr content of the Cr—Al alloy is preferably 10 to 90 mass %. Particularly when thermal-induced deterioration in characteristics of the light-emitting device is to be prevented, the Cr content is preferably controlled to 20 to 80 mass %. In order to more reliably prevent deterioration in characteristics, the Cr content is preferably controlled to 40 to 60 mass %. The Al content of the alloy is preferably 90 to 10 mass %, more preferably 80 to 20 mass %, particularly preferably 60 to 40 mass %. In a small amount of about 10 mass % or less, the alloy may contain a metal other than Cr and Al. Examples of the metal to be incorporated into the alloy include V, Nb, Mo, and W. Also, as the reflectivity of Cr becomes higher after heating at 300° C., it is preferable that the Cr content is high.

The contact resistance between the contact metal layer and an n-type GaN semiconductor layer is greatly affected by the degree of removal of oxide film formed spontaneously on the surface of the n-type GaN semiconductor layer. The surface of the GaN semiconductor layer is oxidized in the atmosphere, thereby forming natural oxide film. Even in the case where the thus-formed oxide film is removed through etching or similar means, the surface is oxidized again, if the surface is exposed to the atmosphere before formation of an electrode. As the oxide film formed on GaN serves as an insulator, the contact resistance at the interface between the electrode and GaN increases, if the entire GaN surface is covered with the oxide film. Therefore, removal of oxide film formed on the surface of an n-type semiconductor layer before formation of the contact metal layer is a key issue.

The bonding pad layer is preferably formed of a metal selected from the group consisting of Au, Al, Ni, and Cu, or formed of an alloy containing the metal, from the viewpoint of attainment of good contact with a bump. The bonding pad layer preferably has a thickness of 100 to 1,000 nm, from the viewpoint of productivity. The thickness is preferably 200 to 800 nm, particularly preferably 200 to 500 nm.

In order to improve adhesion between the contact metal layer and the bonding pad layer, an adhesion layer formed of Ti preferably intervenes between the two layers. The adhesion layer, if employed, preferably has a thickness of 1 to 100 nm. When the thickness is less than 1 nm, the effect of adhesion is poor, whereas when the thickness is more than 100 nm, the Ti film is oxidized in the case where the light-emitting device is in a heated state, and in some cases, the electrical characteristics may be impaired. From the viewpoint of reliable adhesion effect, a thickness of 5 nm or more is preferred, with 10 nm or more being particularly preferred.

An Au—Sn alloy layer or a lead free solder layer can be preferably provided on the bonding pad layer. This layer functions as an adhesion layer in order to adhere the light-emitting device to a sub-mount. This layer preferably has a thickness of 200 nm or more, from the viewpoint of attaining the adhesion. Also, this layer preferably has a thickness of 5 μm or less, from the viewpoint of productivity.

Even in a case of providing the Au—Sn alloy layer or the lead free solder layer, a negative electrode is heated to 300~400° C. for some minutes during mounting. By the heat generated during mounting, a Cr atom in the contact metal layer may diffuse to the bonding pad layer and the Au—Sn alloy layer or the lead free solder layer.

Therefore, in order to prevent the Cr diffusion, a barrier layer can be preferably provided between the contact metal layer and the bonding pad layer or between the bonding pad layer and the Au—Sn alloy layer or the lead free solder layer. The barrier layer is preferably formed of a metal selected from the group consisting of Ti, Zr, Hf, Ta, W, Re, Os, Ir, Pt, Fe, Co, Ni, Ru, Rh, and Pd, or formed of an alloy containing the metal. Among these metals, Ti, Ta, W, and Pt are more preferable. The barrier layer preferably has a thickness of 10 nm or more, from the viewpoint of forming a uniform single layer. Also, it preferably has a thickness of 500 nm or less, from the viewpoint of productivity. The thickness is more preferably 50 to 300 nm.

When the above-mentioned adhesion layer of Ti is provided, it also functions as the barrier layer.

No particular limitation is imposed on the method of forming the contact metal layer, the bonding pad layer, the adhesion layer and the barrier layer, and any conventionally known method such as sputtering or vapor deposition may be employed. The same single method may be employed to form the respective layers, or methods different from one another may be employed. However, formation of all the layers through a single common method is preferred for the purpose of simplifying the steps. Also, no particular limitation is imposed on the method of forming the Au—Sn alloy layer or the lead free solder layer, and any conventionally known method such as vapor deposition, plating and a coating method using a paste, may be employed.

The present inventive gallium nitride-based compound semiconductor light-emitting device can preferably form a lamp.

EXAMPLES

The present invention will next be described in more detail by way of Examples and Comparative Examples. Table 1 shows negative electrode materials employed in the Examples and Comparative Examples, and evaluation of characteristics immediately after formation of a negative electrode film and after a heating test. Needless to say, these Examples and Comparative Examples should not be construed as limiting the invention.

FIG. 2 is a schematic view showing a gallium nitride-based compound semiconductor light-emitting device produced in the present Example.

The gallium nitride-based compound semiconductor stacked structure employed for fabricating the light-emitting device was produced through the following procedure: an AlN buffer layer 2 was formed on a sapphire substrate 1; and an n-type GaN contact layer 3a, an n-type GaN lower cladding layer 3b, an InGaN light-emitting layer 4, a p-type AlGaN upper cladding layer 5b, and a p-type GaN contact layer 5a were successively formed atop the buffer layer 2. The contact layer 3a is formed of n-type GaN doped with Si ($7 \times 10^{18}/cm^3$), the lower cladding layer 3b is formed of n-type GaN doped with Si ($5 \times 10^{18}/cm^3$), and the light-emitting layer 4, having a single quantum well structure, is formed of $In_{0.95}Ga_{0.05}N$. The upper cladding layer 5b is formed of p-type $Al_{0.25}Ga_{0.75}N$ doped with Mg ($1\times10^{18}/cm^3$). The contact layer 5a is formed of p-type GaN doped with Mg ($5\times10^{19}/cm^3$). Stacking of these layers was performed by means of MOCVD under typical conditions which are well known in the art.

A positive electrode 10 and a negative electrode 20 were provided on the gallium nitride-based compound semiconductor stacked structure through the below-described procedure, to thereby fabricate a flip-chip-type gallium nitride-based compound semiconductor light-emitting device.

Firstly, in order to remove the oxide film on the contact layer 5a, the gallium nitride-based compound semiconductor stacked structure was treated in boiling concentrated HCl for 10 minutes.

Then, the positive electrode 10 made of Al was formed on the contact layer 5a through the following procedure. A resist was uniformly applied onto the entire surface of the contact layer, and a portion of the resist provided on the region where the positive electrode was to be formed was removed through a conventional lithographic technique. The thus-formed structure was immersed in buffered hydrofluoric acid (BHF) at room temperature for one minute, followed by forming a positive electrode in a vacuum deposition apparatus. Specifically, the thus-treated structure was placed in a vacuum deposition apparatus, and a positive electrode in the form of Al film was formed at a pressure of $4\times10^{-4}$ Pa or lower through the electron beam method. The thickness of the formed film was adjusted to 100 nm. After film formation, the structure was removed from the vapor deposition apparatus, and a portion of metallic film other than the positive electrode region was removed along with the resist through a lift-off technique.

Subsequently, a negative electrode 20 was formed on the contact layer 3a through the following procedure.

Firstly, an etching mask was formed on the positive electrode through the following procedure. After uniform provision of a resist on the entire surface, a portion of the resist corresponding to a region slightly wider than the positive electrode region was removed through a conventional lithography technique. The structure was placed in a vacuum vapor deposition apparatus, and an Ni layer and a Ti layer were stacked, through the electron beam method, to thicknesses of about 50 nm and 300 nm, respectively, under a pressure of $4\times10^{-4}$ Pa or lower. Thereafter, a portion of metal film other than the positive electrode region was removed along with the resist through the lift-off technique. The etching mask serves as a protective layer for protecting the positive electrode from plasma-induced damage during reactive ion dry etching.

Subsequently, the contact layer 3a was exposed, and a negative electrode was formed on the thus-exposed portion through the following procedure. Specifically, the semiconductor stacked structure was etched through reactive ion dry etching until the contact layer 3a was exposed, and the resultant stacked structure was removed from the dry etching apparatus. The aforementioned etching mask was removed by use of nitric acid or hydrofluoric acid.

After uniform provision of a resist on the entire surface, a portion of the resist corresponding to the exposed contact layer 3a region was removed through a conventional lithography technique. Subsequently, through the aforementioned vapor deposition method, a $Cr_{20}Al_{80}$ contact metal layer 21, a Ti adhesion layer 22, and an Au bonding pad layer 23 were formed at a thickness of 100 nm, 20 nm, and 300 nm, respectively. Thereafter, a portion of metal film other than the negative electrode region was removed along with the resist, thereby fabricating the gallium nitride-based compound semiconductor light-emitting device of the present invention.

In a similar manner, gallium nitride-based compound semiconductor light-emitting devices were fabricated by use of contact metal layer materials, adhesion layer materials, and bonding pad layer materials listed in Table 1. Specific contact resistance values of the thus-produced light-emitting devices were determined through the circular TLM method. The results are also shown in Table 1.

TABLE 1

| | Contact metal layer | Adhesion layer | Bonding pad layer | After film formation | | After heating | |
|---|---|---|---|---|---|---|---|
| | | | | Type | Specific contact resistance $\Omega \cdot cm^2$ | Type | Specific contact resistance $\Omega \cdot cm^2$ |
| 1 | $Cr_{20}Al_{80}$ | Ti | Au | Ohmic | $4 \times 10^{-5}$ | Ohmic | $3 \times 10^{-5}$ |
| 2 | $Cr_{80}Al_{20}$ | Ti | Au | Ohmic | $4 \times 10^{-5}$ | Ohmic | $3 \times 10^{-5}$ |
| 3 | $Cr_{50}Al_{50}$ | Ti | Au | Ohmic | $3 \times 10^{-5}$ | Ohmic | $3 \times 10^{-5}$ |
| 4 | Cr | Ti | Au | Ohmic | $3 \times 10^{-5}$ | Schottky | |
| 5 | Cr | — | Au | Ohmic | $3 \times 10^{-5}$ | Schottky | |
| 6 | Cr | — | Al | Ohmic | $4 \times 10^{-5}$ | Schottky | |
| 7 | Al | Ti | Au | Ohmic | $1 \times 10^{-5}$ | Ohmic | $8 \times 10^{-5}$ |
| 8 | $Cr_{80}Ti_{20}$ | Ti | Au | Ohmic | $9 \times 10^{-5}$ | Schottky | |
| 9 | $Cr_{80}V_{20}$ | Ti | Au | Ohmic | $1 \times 10^{-4}$ | Schottky | |
| 10 | $Cr_{50}Pt_{50}$ | Ti | Au | Schottky | | | |

The heating test was performed in an RTA furnace in the atmosphere at 300° C. for one minute.

When the contact metal layer is formed from a Cr—Al alloy, the film exhibits Ohmic contact characteristics after the heating test has been performed, and the resistance value is not impaired. The characteristics are maintained even when the Cr content reaches 20%. When the contact metal layer is formed from Cr, the as-formed film exhibits Ohmic contact characteristics. However, after the heating test has been performed, the film exhibits Schottky contact characteristics, and the resistance value is considerably impaired. When the contact metal layer is formed from Al, the film exhibits Ohmic contact characteristics after the heating test has been performed. However, the resistance value is impaired. When the contact metal layer is formed from an alloy containing Cr and a metal other than Al (e.g., Cr—Ti alloy, or Cr—V alloy), the as-formed film exhibits Ohmic contact characteristics. However, after the heating test has been performed, the film exhibits Schottky contact characteristics, and the resistance value is considerably impaired.

INDUSTRIAL APPLICABILITY

The flip-chip-type gallium nitride-based compound semiconductor light-emitting device provided according to the present invention is useful for fabricating light-emitting diodes, lamps, etc.

The invention claimed is:

1. A gallium nitride-based compound semiconductor light-emitting device comprising an n-type semiconductor layer of a gallium nitride-based compound semiconductor, a light-emitting layer of a gallium nitride-based compound semiconductor and a p-type semiconductor layer of a gallium nitride-based compound semiconductor formed on a substrate in this order, and having a negative electrode and a positive electrode provided on the n-type semiconductor layer and the p-type semiconductor layer, respectively; wherein the negative electrode comprises a bonding pad layer, a contact metal layer which is in contact with the n-type semiconductor layer, and an Au—Sn alloy layer or a lead free solder layer which is provided on the bonding pad layer, and wherein the contact metal layer is composed of a Cr—Al alloy which has a Cr content of 20 to 80 mass %.

2. A gallium nitride-based compound semiconductor light-emitting device according to claim 1, wherein the Cr—Al alloy has a Cr content of 40 to 60 mass %.

3. A gallium nitride-based compound semiconductor light-emitting device according to claim 1, wherein the contact metal layer has a thickness of 1 to 500 nm.

4. A gallium nitride-based compound semiconductor light-emitting device according to claim 3, wherein the contact metal layer has a thickness of 10 nm or more.

5. A gallium nitride-based compound semiconductor light-emitting device according to claim 1, wherein the bonding pad layer is formed of a metal selected from the group consisting of Au, Al, Ni, and Cu, or an alloy containing the metal.

6. A gallium nitride-based compound semiconductor light-emitting device according to claim 1, wherein the bonding pad layer has a thickness of 100 to 1,000 nm.

7. A gallium nitride-based compound semiconductor light-emitting device according to claim 6, wherein the bonding pad layer has a thickness of 200 to 500 nm.

8. A gallium nitride-based compound semiconductor light-emitting device according to claim 1, wherein the Au—Sn alloy layer has a thickness of 200 nm or more.

9. A gallium nitride-based compound semiconductor light-emitting device according to claim 1, wherein the lead free solder layer has a thickness of 200 nm or more.

10. A gallium nitride-based compound semiconductor light-emitting device according to claim 1, wherein the light-emitting device has an adhesion layer formed of Ti between the contact metal layer and the bonding pad layer.

11. A gallium nitride-based compound semiconductor light-emitting device according to claim 10, wherein the adhesion layer has a thickness of 1 to 100 nm.

12. A gallium nitride-based compound semiconductor light-emitting device according to claim 11, wherein the adhesion layer has a thickness of 10 nm or more.

13. A gallium nitride-based compound semiconductor light-emitting device according to claim 1, wherein the light-emitting device has a barrier layer between the contact metal layer and the bonding pad layer.

14. A gallium nitride-based compound semiconductor light-emitting device according to claim 13, wherein the barrier layer is formed of a metal selected from the group consisting of Ti, Zr, Hf, Ta, W, Re, Os, Ir, Pt, Fe, Co, Ni, Ru, Rh, and Pd, or an alloy containing the metal.

15. A gallium nitride-based compound semiconductor light-emitting device according to claim 14, wherein the barrier layer is formed of a metal selected from the group consisting of Ti, Ta, W, and Pt, or an alloy containing the metal.

16. A gallium nitride-based compound semiconductor light-emitting device according to claim 13, wherein the barrier layer has a thickness of 10 to 500 nm.

17. A gallium nitride-based compound semiconductor light-emitting device according to claim 16, wherein the barrier layer has a thickness of 50 to 300 nm.

18. A gallium nitride-based compound semiconductor light-emitting device according to claim 1, wherein the light-emitting device has a barrier layer between the bonding pad layer and the Au—Sn alloy layer.

19. A gallium nitride-based compound semiconductor light-emitting device according to claim 1, wherein the light-emitting device has a barrier layer between the bonding pad layer and the lead free solder layer.

20. A gallium nitride-based compound semiconductor light-emitting device according to claim 1, wherein the light-emitting device is of a flip-chip type.

21. A negative electrode for use in a gallium nitride-based compound semiconductor light-emitting device comprising a bonding pad layer and a contact metal layer which is in contact with the n-type semiconductor layer, wherein the contact metal layer is composed of a Cr—Al alloy.

22. A negative electrode for use in a gallium nitride-based compound semiconductor light-emitting device according to claim 21, wherein the light-emitting device is of a flip-chip type.

* * * * *